United States Patent
Zhu et al.

(10) Patent No.: US 10,168,747 B2
(45) Date of Patent: Jan. 1, 2019

(54) SERVER

(71) Applicants: INVENTEC (PUDONG) TECHNOLOGY CORPORATION, Shanghai (CN); INVENTEC CORPORATION, Taipei (TW)

(72) Inventors: Zhi-Feng Zhu, Shanghai (CN); Ping-Wei Peng, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/828,090

(22) Filed: Nov. 30, 2017

(65) Prior Publication Data

US 2018/0157295 A1 Jun. 7, 2018

(30) Foreign Application Priority Data

Dec. 2, 2016 (CN) .......................... 2016 1 1110261

(51) Int. Cl.
| | |
|---|---|
| *H05K 7/14* | (2006.01) |
| *G06F 1/18* | (2006.01) |
| *G11B 33/12* | (2006.01) |
| *H05K 7/16* | (2006.01) |
| *H05K 7/10* | (2006.01) |
| *H05K 5/02* | (2006.01) |
| *G11B 33/02* | (2006.01) |

(52) U.S. Cl.
CPC ............ *G06F 1/187* (2013.01); *G11B 33/128* (2013.01); *H05K 5/023* (2013.01); *H05K 7/1076* (2013.01); *H05K 7/1487* (2013.01); *H05K 7/1489* (2013.01); *H05K 7/16* (2013.01); *G11B 33/02* (2013.01)

(58) Field of Classification Search
None
See application file for complete search history.

(56) References Cited

U.S. PATENT DOCUMENTS

| | | | | |
|---|---|---|---|---|
| 4,426,122 A | * | 1/1984 | Lainez ................. | A62B 18/082 361/679.55 |
| 6,404,625 B1 | * | 6/2002 | Chen ....................... | G06F 1/184 312/223.1 |
| 6,580,603 B1 | * | 6/2003 | Resnick ................. | G06F 1/184 312/223.1 |
| 6,887,090 B2 | * | 5/2005 | Lin ....................... | H05K 7/1007 439/259 |

(Continued)

*Primary Examiner* — Xanthia C Cunningham
(74) *Attorney, Agent, or Firm* — Maschoff Brennan

(57) ABSTRACT

A server includes a tray, a handle structure, a first hard disk assembly and a second hard disk assembly. The tray is removably disposed on a server cabinet. Two ends of the handle structure are respectively slidably pivoted to two inner walls of the tray. The first hard disk assembly is movably disposed in the tray. The second hard disk assembly is disposed in the tray. The first hard disk assembly and the second hard disk assembly are placed side by side. Two sides of the first hard disk assembly, which are opposite to each other, are pivoted to the handle structure. When the handle structure is pivoted and slide relative to the tray, the first hard disk assembly is pivotable between a stored position and an inclined position by the handle structure.

9 Claims, 8 Drawing Sheets

(56) References Cited

U.S. PATENT DOCUMENTS

| | | | | |
|---|---|---|---|---|
| 7,375,959 B2* | 5/2008 | Chang | | G06F 1/184 |
| | | | | 312/223.2 |
| 8,009,385 B2* | 8/2011 | Starr | | H05K 7/1487 |
| | | | | 360/98.01 |
| 8,164,896 B1* | 4/2012 | Wang | | G06F 1/1658 |
| | | | | 361/679.33 |
| 9,122,458 B2* | 9/2015 | Yu | | G06F 1/185 |
| 9,229,496 B2* | 1/2016 | Cravens | | G06F 1/187 |
| 9,674,978 B2* | 6/2017 | Wu | | G06F 1/185 |
| 9,717,158 B2* | 7/2017 | Della Fiora | | H05K 7/1487 |
| 9,826,658 B1* | 11/2017 | Mao | | H05K 7/1489 |
| 9,854,698 B2* | 12/2017 | Della Fiora | | H05K 7/1489 |
| 2005/0219964 A1* | 10/2005 | Pollard | | G11B 15/6835 |
| | | | | 369/30.27 |
| 2006/0171110 A1* | 8/2006 | Li | | G06F 1/184 |
| | | | | 361/679.37 |
| 2009/0273901 A1* | 11/2009 | Jaramillo | | H05K 7/1492 |
| | | | | 361/679.58 |
| 2010/0033924 A1* | 2/2010 | Olesiewicz | | G06F 1/185 |
| | | | | 361/679.57 |
| 2012/0145877 A1* | 6/2012 | Chiu | | G06F 1/20 |
| | | | | 248/674 |
| 2013/0070422 A1* | 3/2013 | Dunham | | G06F 1/187 |
| | | | | 361/725 |
| 2014/0055959 A1* | 2/2014 | Manda | | G11B 33/128 |
| | | | | 361/728 |
| 2014/0362515 A1* | 12/2014 | Pronozuk | | H05K 7/1488 |
| | | | | 361/679.31 |
| 2015/0192970 A1* | 7/2015 | Jau | | G06F 1/187 |
| | | | | 361/679.33 |
| 2015/0257295 A1* | 9/2015 | Lu | | H04Q 1/021 |
| | | | | 312/223.2 |
| 2017/0045921 A1* | 2/2017 | Norton | | H05K 7/1487 |
| 2018/0092236 A1* | 3/2018 | Lin | | H05K 7/1489 |

* cited by examiner

SERVER

CROSS-REFERENCE TO RELATED APPLICATIONS

This non-provisional application claims priority under 35 U.S.C. § 119(a) on Patent Application No(s). 201611110261.4 filed in China on Dec. 2, 2016, the entire contents of which are hereby incorporated by reference.

TECHNICAL FIELD

The disclosure relates to a server, more particularly to a server having a drawable tray.

BACKGROUND

With the development of cloud technology, companies require more and more servers, such as web servers, email servers or database servers, in order to provide more services. All of the servers are placed in a limited room, so the installation and maintenance of these servers become very important.

Conventionally, there are lots of servers in one server cabinet, and each server usually has two hard disk assemblies in order to increase information density. One of the hard disk assemblies is at the outer side of the server, the other one is at the inner side of the server, and each hard disk assembly can store many hard disks. When the hard disks, a fan, a memory module, a PCIe (Peripheral component Interconnect Express) or the other electrical components are required to be replaced or repaired, the server has to be detached from the server cabinet, but the process of detaching the server is complicated and time-consuming.

SUMMARY

One embodiment of the disclosure provides a server including a tray, a handle structure, a first hard disk assembly and a second hard disk assembly. The tray is removably disposed on a server cabinet. Two ends of the handle structure are respectively slidably pivoted to two inner walls of the tray. The first hard disk assembly is movably disposed in the tray. The second hard disk assembly is disposed in the tray. The first hard disk assembly and the second hard disk assembly are placed side by side. Two sides of the first hard disk assembly, which are opposite to each other, are pivoted to the handle structure. When the handle structure is pivoted and slide relative to the tray, the first hard disk assembly is pivotable between a stored position and an inclined position by being driven by the handle structure. When the first hard disk assembly is at the stored position, the first hard disk assembly is laid on the tray. When the first hard disk assembly is pivoted from the stored position to the inclined position, a rear side of the first hard disk assembly presses against the tray, and a front side of the first hard disk assembly is relatively away from the tray in order to leave a first opening at the front side exposed.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
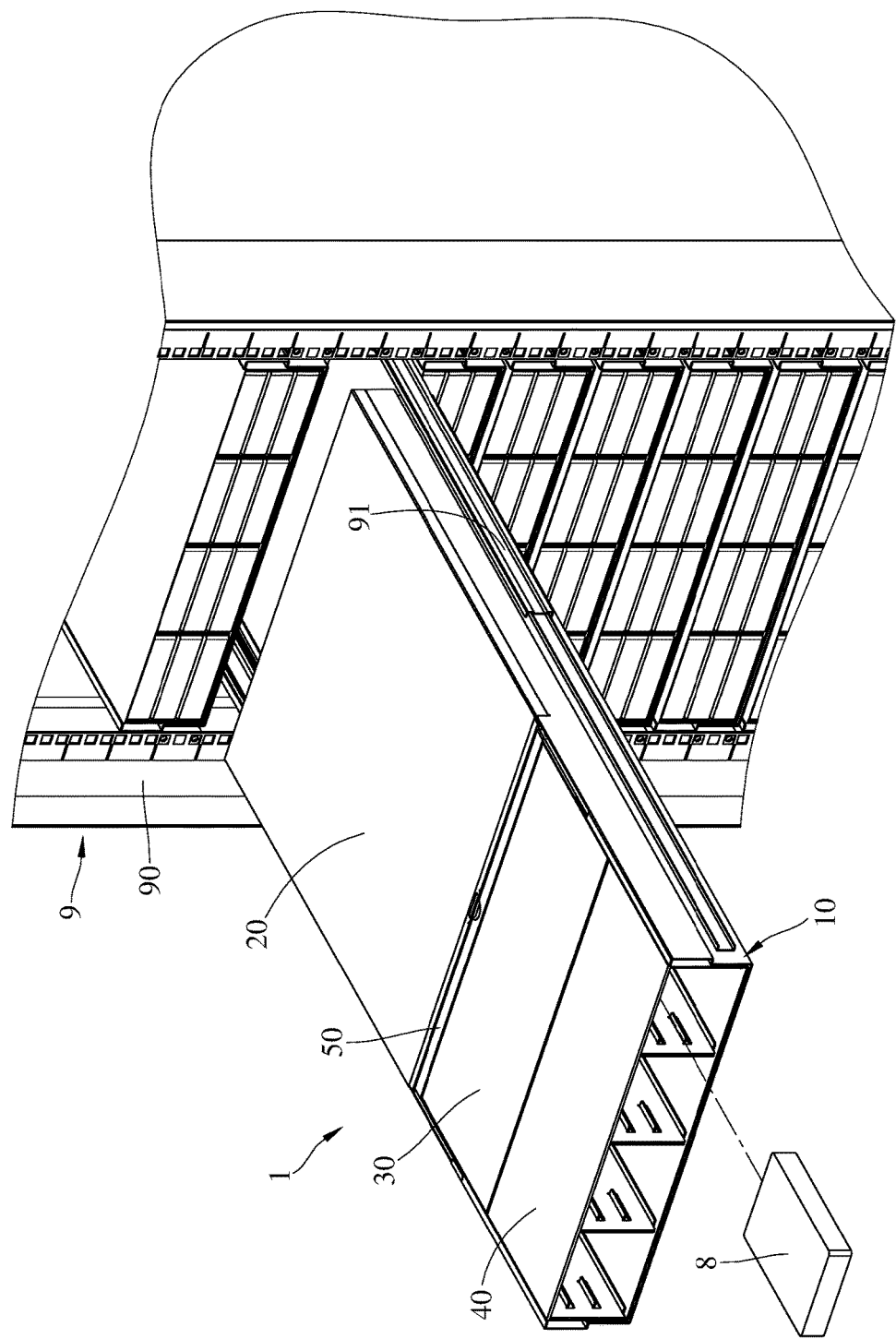
FIG. 1 is a perspective view of a server being disposed on a server cabinet according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, lines or bus are omitted in some of the figures.

Moreover, the terms used in the present disclosure, such as technical and scientific terms, have its own meanings and can be comprehended by person skill in the art, unless the term is additionally defined in the present disclosure. That is, the terms used in the following paragraphs should be read on the meaning commonly used in the related fields and will not be overly explained, unless the term has a specific meaning in the present disclosure.

Firstly, please refer to FIG. 1. FIG. 1 is a perspective view of a server being disposed on a server cabinet according to one embodiment of the disclosure. In this embodiment, a server 1 is provided. The server 1 is adaptive to be disposed into a server cabinet 9. The server cabinet 9 has a frame 90 and a plurality of rail sets 91. The rail sets 91 are disposed on the frame 90, and the server 1 is disposed on the rail sets 91, such that the server 1 is drawably disposed on the frame 90 through the rail sets 91. As shown in FIG. 1, the server 1 is able to be drawn out from the frame 90 or placed into the frame 90 through the rail sets 91, but the present disclosure is not limited thereto.

Figure 2:
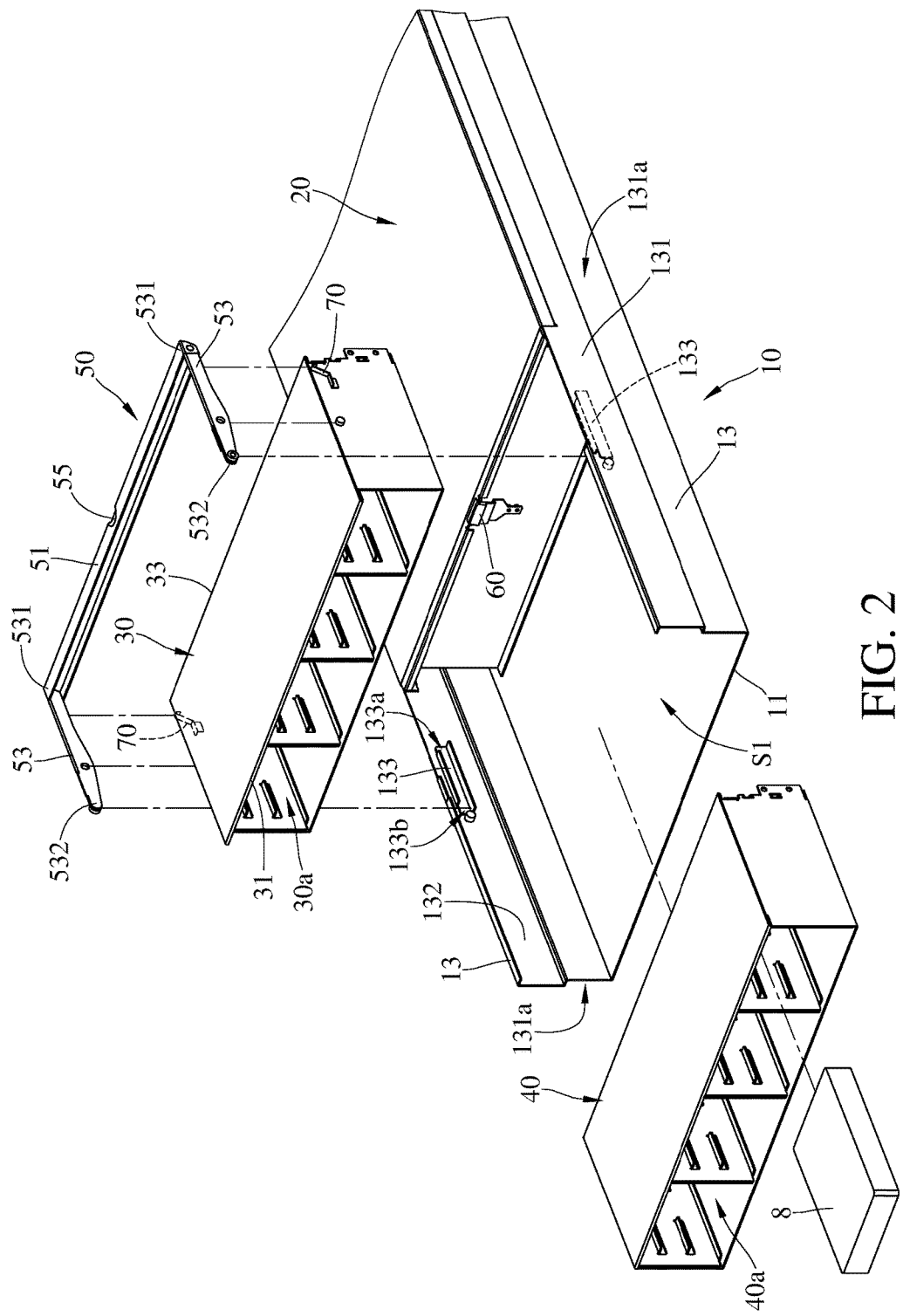
FIG. 2 is an exploded view of the server in FIG. 1.
Figure 3:
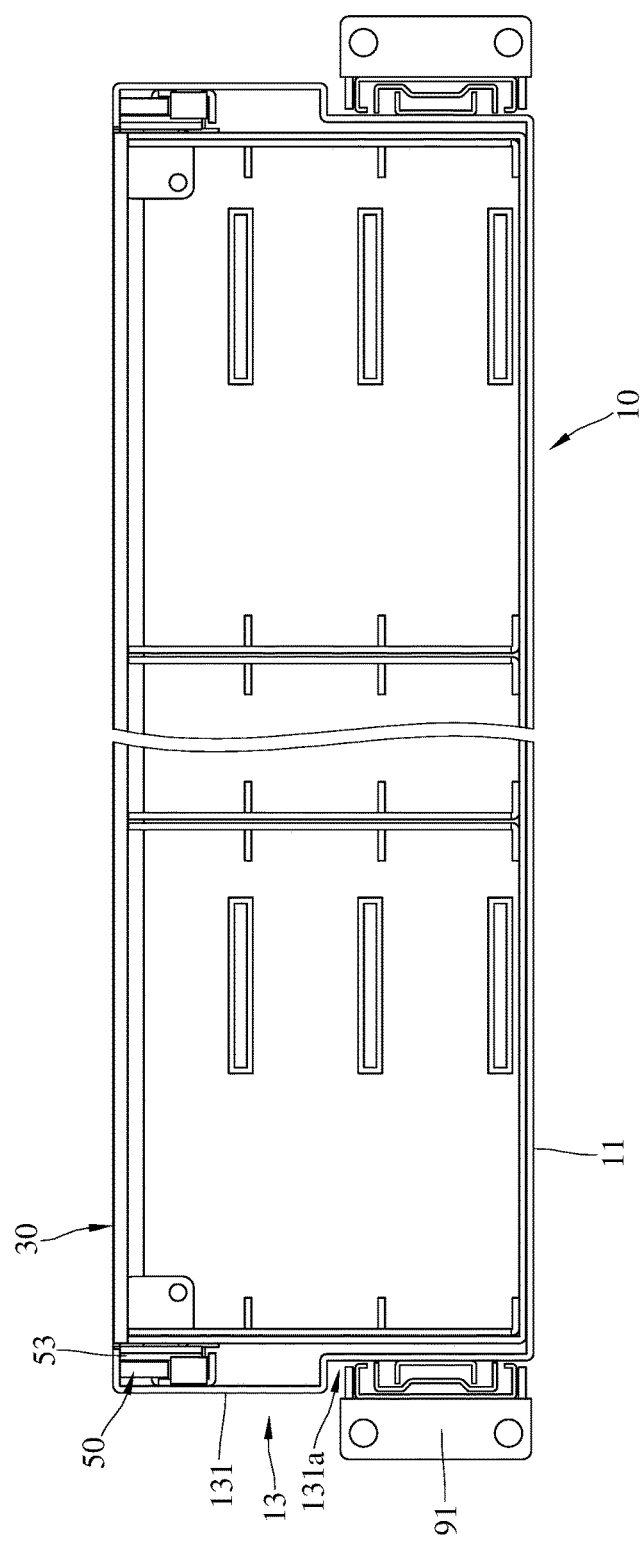
FIG. 3 is a front view of the server in FIG. 1.

Please refer to FIGS. 2 to 3. FIG. 2 is an exploded view of the server in FIG. 1, and FIG. 3 is a front view of the server in FIG. 1. In detail, the server 1 includes a tray 10, a processing module 20, a first hard disk assembly 30, a second hard disk assembly 40 and a handle structure 50. For the purpose of illustration, the second hard disk assembly 40 and the frame 90 are omitted in FIG. 3.

The tray 10 includes a bottom plate 11 and two side plates 13. The two side plates 13 are respectively disposed on two sides of the bottom plate 11 which are opposite to each other. The bottom plate 11 and the two side plates 13 together form a storage space S1. The rail sets 91 are respectively disposed on the side plates 13 so that the tray 10 is drawably disposed on the frame 90. In more detail, as shown in FIG. 3, in this embodiment, an external surface 131 of each side plate 13 has an indentation 131a, and the rail sets 91 are disposed on the indentations 131a of the side plates 13.

In addition, in this embodiment, each side plate 13 has an inner wall 132, and there are two rails 133 respectively located on the inner walls 132. Each rail 133 has an enter end 133a and a stop end 133b opposite to each other. In this embodiment, each enter end 133a has an opening, the handle structure 50 is able to be installed and slid on the rails 133 or removed from the rails 133 via the enter ends 133a, and the handle structure 50 would be stopped when it slides to the stop ends 133b. Furthermore, each stop end 133b has an opening and a stopper (both not numbered), the opening is covered by a structure protruding from one of the side plates 13 in order to prevent the handle structure 50 from detaching from the rails 133. The so called stopper is a structure protruding from the inner wall 132 of one of the side plates 13 and locating at the end of the rail 133, for preventing the handle structure 50 from detaching from the rails 133 in the extension direction of the rail 133. The stopper is, for example, a rivet.

The processing module 20 is stored in the storage space S1. The processing module 20 has, for example, a main board, a fan assembly and other electrical components (not shown) inside. The processing module 20 is able to be electrically connected to the server cabinet 9 or other servers via the inner wires (not shown).

The first hard disk assembly 30 and the second hard disk assembly 40 are both stored in the storage space S1 of the tray 10. In detail, the second hard disk assembly 40 and the processing module 20 are respectively located at a front side 31 and a rear side 33 of the first hard disk assembly 30 which are opposite to each other. In this embodiment, according to the relative location of the first hard disk assembly 30 and the second hard disk assembly 40 inside the tray 10, the first hard disk assembly 30 is also called an inner hard disk assembly, and the second hard disk assembly 40 is also called an outer hard disk assembly. In addition, the first hard disk assembly 30 has a first opening 30a located at a side of the first hard disk assembly 30 facing the second hard disk assembly 40, and the second hard disk assembly 40 has a second opening 40a located at a side of the second hard disk assembly 40 facing away the first hard disk assembly 30. Thus, one or more hard disks 8 are able to be installed into the first hard disk assembly 30 or removed from the first hard disk assembly 30 via the first opening 30a; similarly, one or more hard disks 8 are able to be installed into the second hard disk assembly 40 or removed from the second hard disk assembly 40 via the second opening 40a. However, the present disclosure is not limited to the number of the hard disks 8 in each hard disk assembly, and is not limited to the configuration or type of the hard disk 8.

The handle structure 50 includes a bridge part 51 and two supporting parts 53. In detail, each supporting part 53 has a first end 531 and a second end 532 opposite to each other. The bridge part 51 is located between and connected to the two first ends 531 of the two supporting parts 53. The two second ends 532 of the two supporting parts 53 are able to enter into the two rails 133 via the two enter ends 133a, and then the two second ends 532 are respectively slidable and pivotable along the two rails 133. In addition, in this embodiment, the two supporting parts 53 are respectively pivoted to two sides of the first hard disk assembly 30 opposite to each other. In detail, a part of one of the supporting parts 53 between the first end 531 and the second end 532 is pivoted to a side of the first hard disk assembly 30 relative away from the bottom plate 11, and a part of the other supporting part 53 between the first end 531 and the second end 532 is pivoted to the opposite side of the first hard disk assembly 30 relative away from the bottom plate 11 as well. Therefore, the first hard disk assembly 30 is movably disposed in the tray 10 through the handle structure 50. In addition, the location where the first hard disk assembly 30 is pivoted to the handle structure 50 can be changed according to actual requirements, and the present disclosure is not limited thereto. Furthermore, from the point of view of FIG. 3, areas (not numbered) under the supporting parts 53 and between the supporting parts 53 and the side plates 13 are able to be taken as a channel for wires (not shown) of the second hard disk assembly 40.

Figure 4:
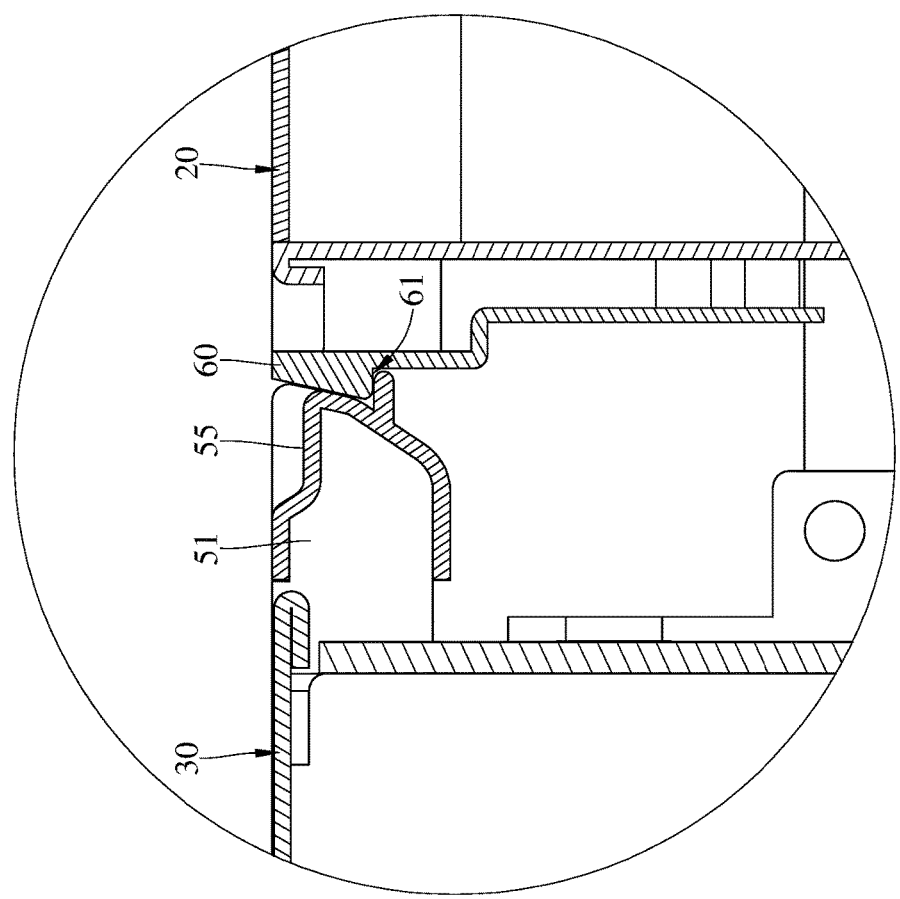
FIG. 4 is a partial enlarged side view of the server in FIG. 1.

Please refer to FIG. 2 and further refer to FIG. 4. FIG. 4 is a partial enlarged side view of the server in FIG. 1. In this embodiment, the server 1 further includes a second fastener 60 and two recovering components 70, and the handle structure 50 further includes a first fastener 55. The second fastener 60 is an elastic and flexible metal plate, and is disposed on a side of the processing module 20 facing the first hard disk assembly 30. The second fastener 60 has a fastening indentation 61. The first fastener 55 is disposed on the bridge part 51, and is able to be fixed to the fastening indentation 61 of the second fastener 60. Each of the recovering components 70 is an elastic and flexible metal plate. The recovering components 70 are respectively disposed on two opposite sides of the first hard disk assembly 30. In detail, one end of each recovering component 70 is fixed to the first hard disk assembly 30, and the opposite end is disposed under the supporting part 53 of the handle structure 50. When the first fastener 55 of the handle structure 50 is engaged with the second fastener 60, the recovering components 70 are pressed by the supporting parts 53 so as to store elastic energy. When the first fastener 55 of the handle structure 50 is disengaged from the fastening indentation 61 of the second fastener 60, the recovering components 70 release the elastic energy to push one side of the supporting parts 53 upwards. The detail description of operating the server 1 is described in the following paragraphs.

Figure 5:
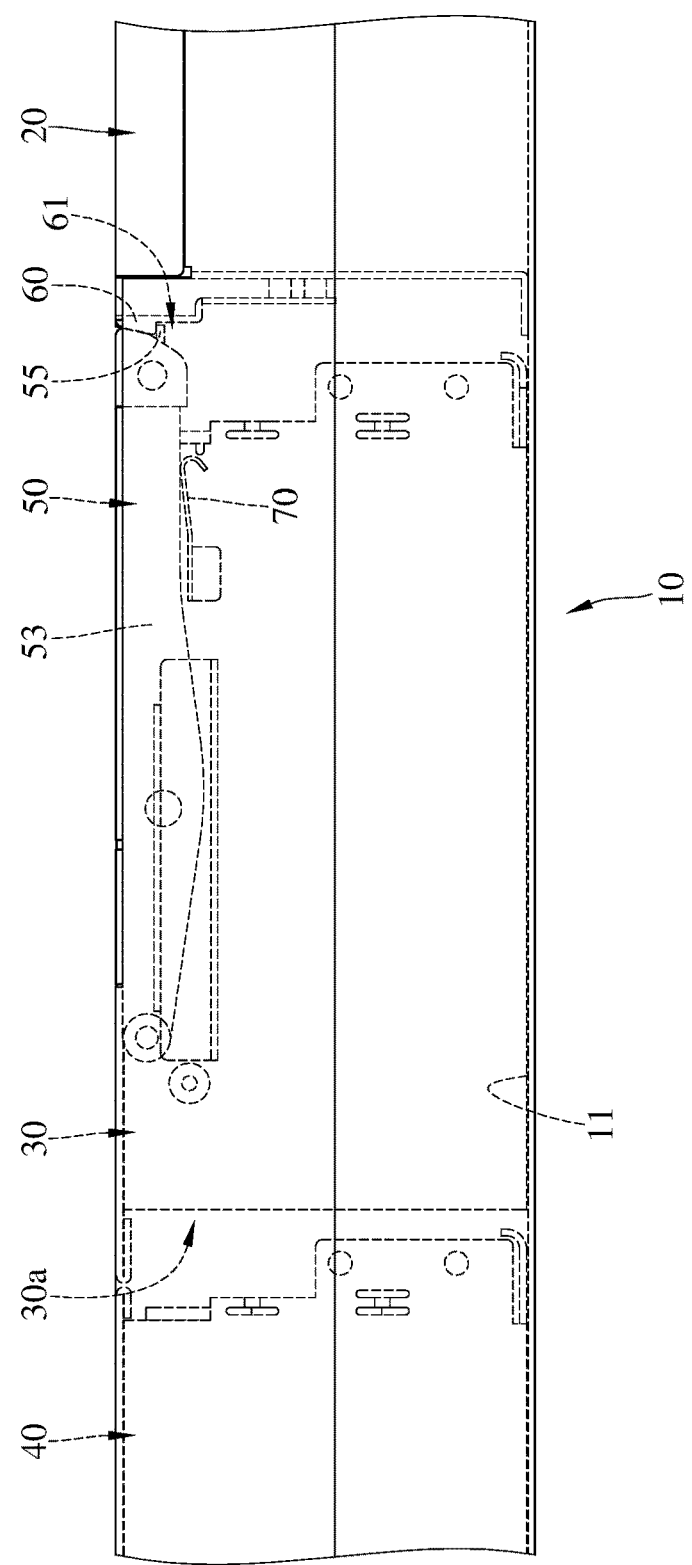
FIG. 5 is a side view of the server in FIG. 1 when a first hard disk assembly is at a stored position.
Figure 6A:
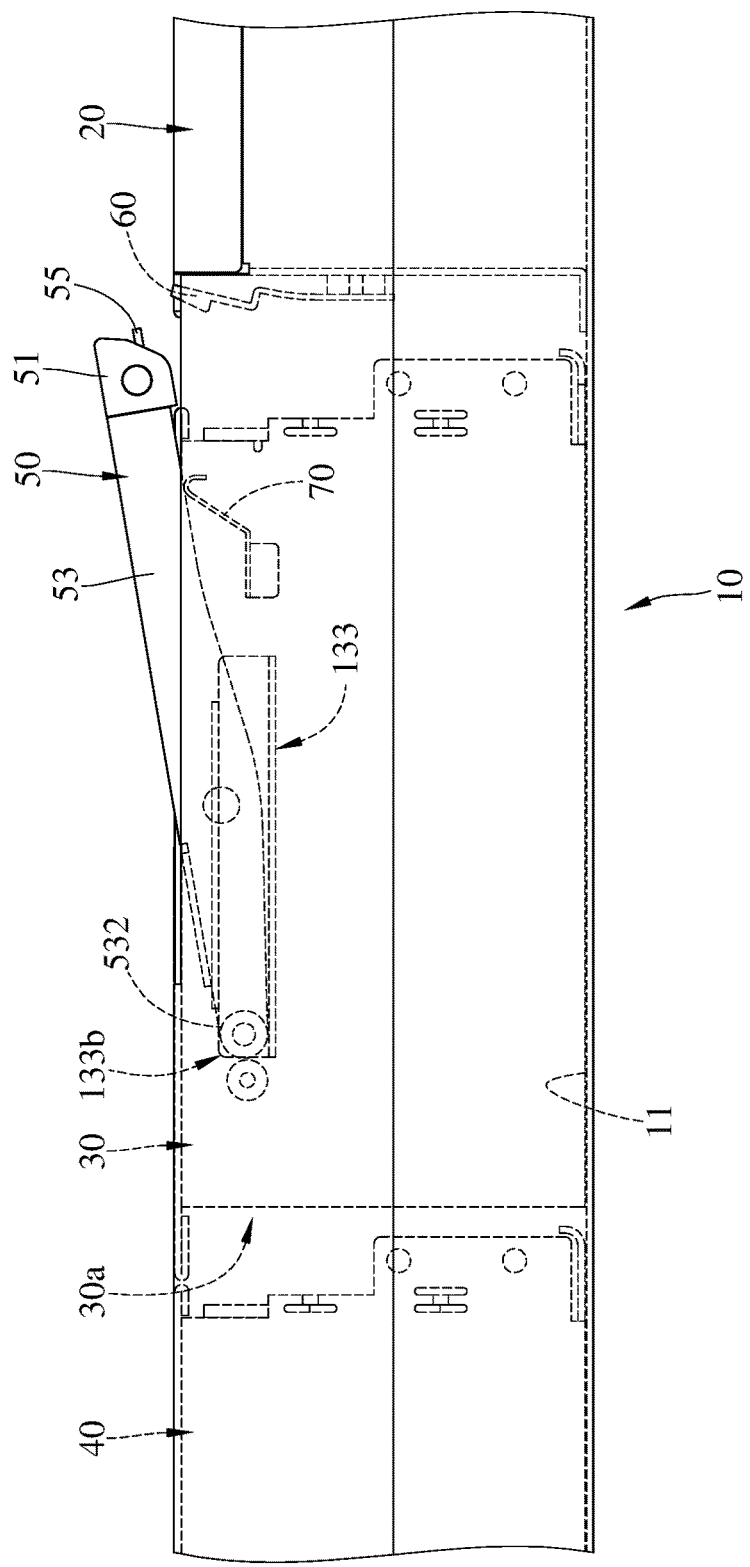
FIG. 6A is a side view of the server in FIG. 1 when one side of a handle structure is being lifted.
Figure 6B:
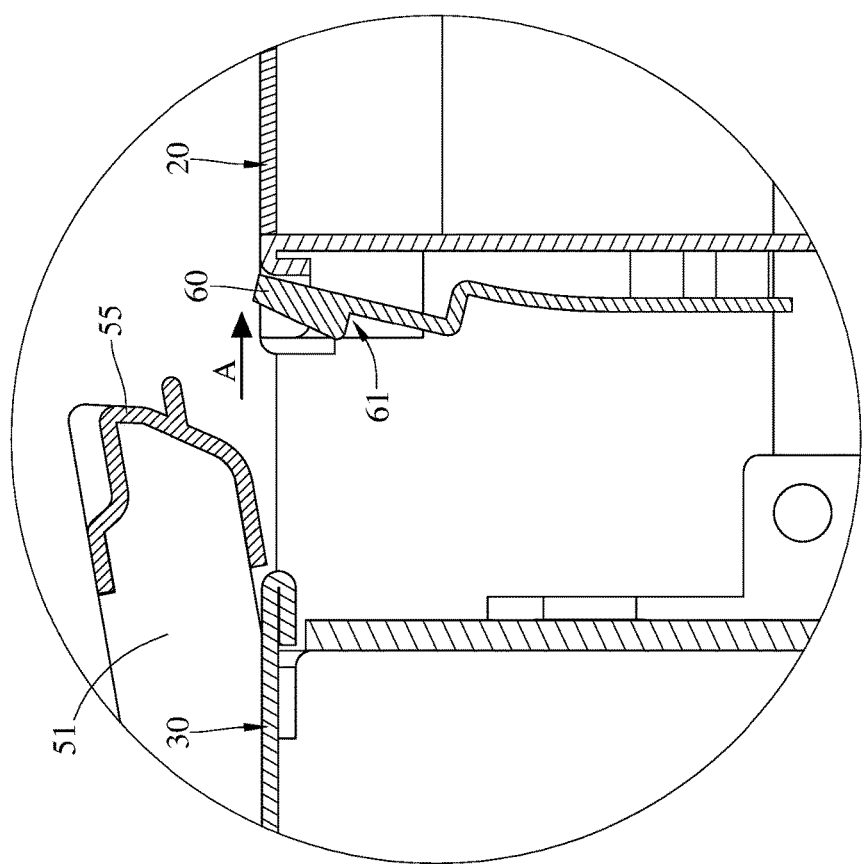
FIG. 6B is a partial enlarged side view of the server in FIG. 6A.
Figure 7:
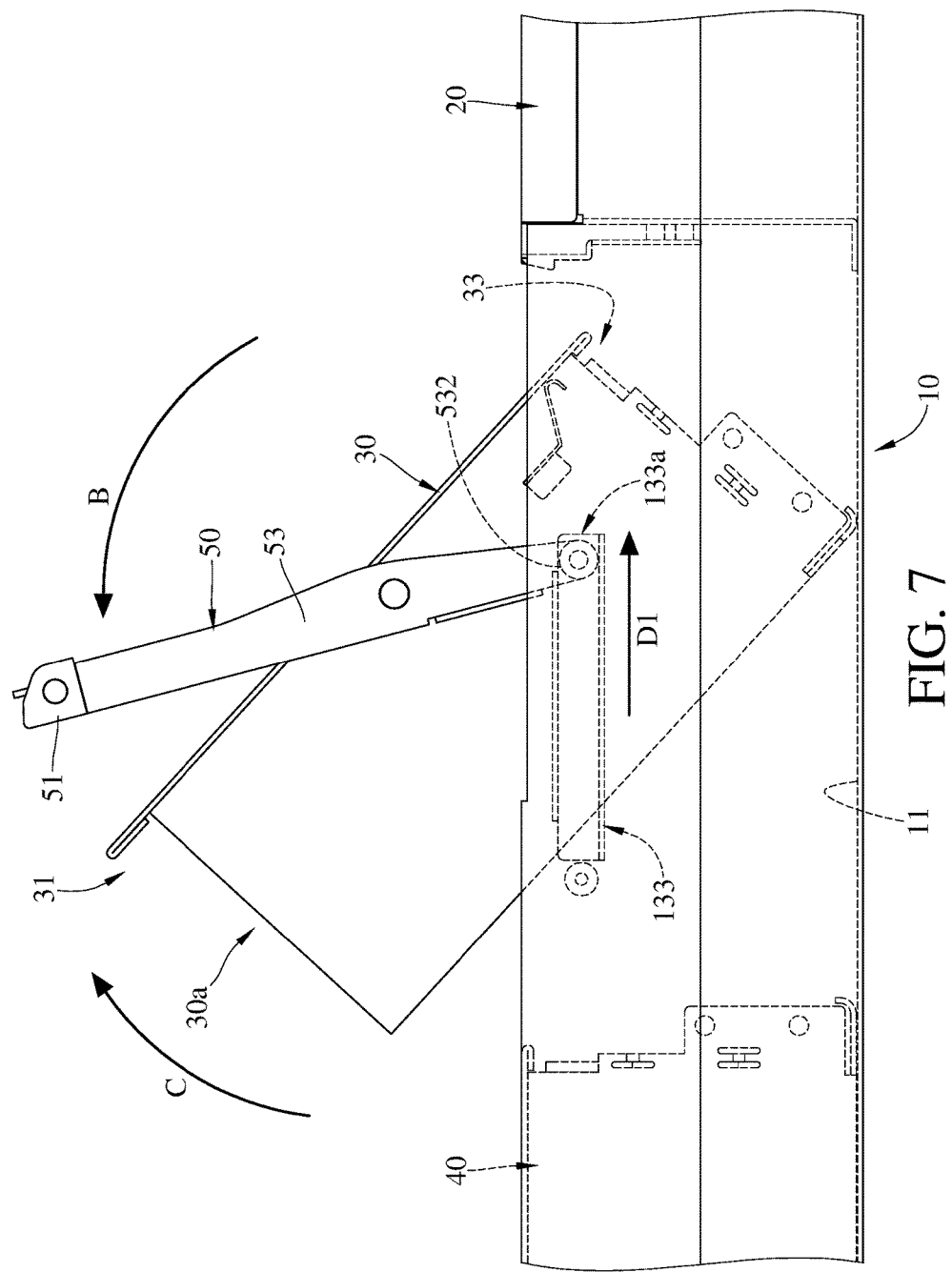
FIG. 7 is a side view of the server in FIG. 1 when the first hard disk assembly is in an inclined position.

Please refer to FIG. 4 and FIGS. 5 to 7. FIG. 5 is a side view of the server in FIG. 1 when a first hard disk assembly is at a stored position; FIG. 6A is a side view of the server in FIG. 1 when one side of a handle structure is being lifted; FIG. 6B is a partial enlarged side view of the server in FIG. 6A; and FIG. 7 is a side view of the server in FIG. 1 when the first hard disk assembly is at an inclined position. In addition, in FIGS. 5 to 7, at least the first hard disk assembly 30 and the second hard disk assembly 40 are already outside of the frame 90 by the rail sets 91.

Firstly, as shown in FIG. 4 and FIG. 5, the first hard disk assembly 30 is in a stored position. The stored position is a state in which the first hard disk assembly 30 is laid on the tray 10, and the handle structure 50 is laid on the first hard disk assembly 30. When the first hard disk assembly 30 is in the stored position, the first hard disk assembly 30 and the handle structure 50 are completely stored in the storage space S1 of the tray 10, the first opening 30a of the first hard disk assembly 30 is covered by the second hard disk assembly 40, and only the second opening 40a of the second hard disk assembly 40 is exposed. Thus, the hard disk 8 is able to be installed into or removed from the second hard disk assembly 40 through the second opening 40a. In addition, the first fastener 55 of the handle structure 50 is engaged with the fastening indentation 61 of the second fastener 60, such that the handle structure 50 is fixed to the processing module 20. As a result, the first hard disk assembly 30 is fixed on the tray 10. Furthermore, the two supporting parts 53 of the handle structure 50 respectively press against the two recovering components 70 while they are moved toward the bottom plate 11, such that the two recovering components 70 are deformed and stores elastic energy.

Then, as shown in FIGS. 6A to 6B, the second fastener 60 are pushed in the direction of arrow A in order to release the first fastener 55 from the second fastener 60. In the mean time, the two recovering components 70 release the elastic energy to push the two supporting parts 53 upward so as to spring the two first ends 531 of the two supporting parts 53 away from the bottom plate 11, and the two second ends 532 are moved from the stop ends 133b to the enter ends 133a along the two rails 133. As a result, the handle structure 50 is inclined and the bridge part 51 protrudes from the top surface of the first hard disk assembly 30 so that the handle structure 50 is convenient to handle or use.

Then, as shown in FIG. 7, a user is able to grab the bridge part 51 and pivot the handle structure 50 in a direction of arrow B. Since the second ends 532 of the supporting parts 53 of the handle structure 50 are slidably pivoted to the rails 133, and the first hard disk assembly 30 is pivoted to the supporting parts 53, the second ends 532 of the supporting parts 53 are able to be moved from the stop ends 133b to the enter ends 133a along the first direction D1 during the movement of the handle structure 50, so that the first hard disk assembly 30 is moved from the stored position (FIG. 5) to the inclined position (FIG. 7) by being driven by the handle structure 50. While the first hard disk assembly 30 is moved to the inclined position from the stored position, the handle structure 50 is pivoted by taking a line passing through the pivot points with the rails 133 as a pivot axis while the handle structure 50 is slid along the rails 133, and the first hard disk assembly 30 is pivoted in the opposite direction (e.g. the direction of arrow C) by taking a line passing through the pivot points with the supporting parts 53 as a rotation axis. In such a case, the rear side 33 is moved downward and presses against the bottom plate 11 of the tray 10, and the front side 31 is moved upward and relatively away from the bottom plate 11 of the tray 10. As a result, the first opening 30a of the first hard disk assembly 30 is exposed to the outer environment. Accordingly, when the first hard disk assembly 30 is in the inclined position, one or more hard disks 8 are able to be installed into or removed from the first hard disk assembly 30 through the first opening 30a. In addition, when the first hard disk assembly 30 is in the inclined position, the second ends 532 of the supporting parts 53 of the handle structure 50 is slid to the enter ends 133a so that the first hard disk assembly 30 is able to be taken out of the tray 10 by pulling up the handle structure 50. During installation of the first hard disk assembly 30, the first hard disk assembly 30 is able to be placed into the tray 10 by carrying the handle structure 50, and then the handle structure 50 is pivoted in a direction opposite to the direction of arrow B so that the second ends 532 of the supporting parts 53 of the handle structure 50 enter the rails 133 via the enter ends 133a and slide toward the stop ends 133b, and the first hard disk assembly 30 is driven by the handle structure 50 to move from the inclined position to the stored position along a direction opposite to the direction of arrow C. It is noted that the disclosure is not limited to the configuration of the stop ends 133b. In some embodiments, the stop ends of the rails may have no openings, but it still can prevent the supporting parts 53 of the handle structure 50 from detach from the rails.

According to the server 1 discussed above, the first hard disk assembly 30 is driven by the handle structure 50 to pivot relative to the tray 10, such that the first opening 30a of the first hard disk assembly 30 is able to be moved upward (or lifted) and exposed to the outer environment, which is beneficial for installing hard disks into the first hard disk assembly 30 or replacing hard disks from the first hard disk assembly 30. Also, by comparing with the conventional server in which the outer hard disk assembly has to be completely pulled out during the installation or removal of hard disk in the inner hard disk assembly, the second hard disk assembly 40 (i.e. the outer hard disk assembly) of the server 1 of the disclosure does not have to be completely pulled out during the installation or removal of hard disk in the first hard disk assembly 30 (i.e. the inner hard disk assembly), so the pressure on the rail sets 91 is reduced, thereby preventing the rail sets 91 from deforming during operation. As a result, the yield rate of the testing process is improved, and the server of the disclosure has a high reliability.

In addition, it is noted that the disclosure is not limited to the location of the recovering component 70 in the aforementioned embodiment as long as it can offer elastic energy to move one side of the handle structure 50 upward for the user to use. For example, in some embodiments, one end of each recovering component 70 is movably located under one of the supporting parts 53, and the other end is fixed to the inner wall 132 of one of the side plates 13. Furthermore, the disclosure is not limited to the number or the configuration of the recovering component 70. For example, in some embodiments, the server may have only one recovering component, and the recovering component 70 may be a clip.

Moreover, the disclosure is not limited to the configurations of the first fastener 55 and the second fastener 60. Any design, which can make the handle structure 50 to lie on and fix to the first hard disk assembly 30 in the stored position, falls within the scope of the disclosure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server, comprising:
   a tray removably disposed on a server cabinet;
   a handle structure, two ends of the handle structure respectively slidably pivoted to two inner walls of the tray;
   a first hard disk assembly movably disposed in the tray;
   a second hard disk assembly disposed in the tray, the first hard disk assembly and the second hard disk assembly being placed side by side; and
   a processing module being disposed in the tray, the second hard disk assembly and the processing module are respectively located at a front side and a rear side of the first hard disk assembly, the second hard disk assembly being side by side with the front side of the first hard disk assembly, and the processing module being side by side with the rear side of the first hard disk assembly,
   wherein two sides of the first hard disk assembly, which are opposite to each other, are pivoted to the handle structure,
   wherein when the handle structure is pivoted and slide relative to the tray, the first hard disk assembly is pivotable between a stored position and an inclined position by being driven by the handle structure, wherein when the first hard disk assembly is in the stored position, the first hard disk assembly is laid on the tray and a first opening at the front side of the first hard disk assembly is covered by the second hard disk assembly, and wherein when the first hard disk assembly is pivoted from the stored position to the inclined position, the rear side of the first hard disk assembly presses against the tray, and the front side of the first hard disk assembly is relatively away from the tray in order to leave the first opening at the front side exposed.

2. The server according to claim 1, wherein the handle structure is slidable relative to the tray in a first direction to pivot the first hard disk assembly from the stored position to the inclined position, when the first hard disk assembly is pivoted from the stored position to the inclined position, the handle structure and the first hard disk assembly are pivoted in opposite directions until the rear side of the first hard disk assembly presses against the tray, and the front side of the first hard disk assembly is lifted relative to the tray in order to leave the first opening exposed.

3. The server according to claim 1, wherein the handle structure comprises a bridge part and two supporting parts, each of the supporting parts has a first end and a second end opposite to each other, the bridge part is located between and connected to the two first ends of the two supporting parts, the tray comprises a bottom plate and two side plates, the two side plates are respectively disposed on two sides of the bottom plate opposite to each other, the two side plates and the bottom plate together form an storage space, the tray has two rails, the two rails are respectively located at the two inner walls of the two side plates, the two supporting parts are respectively pivoted to two sides of the first hard disk assembly opposite to each other, and the two second ends of the two supporting parts are respectively slidably connected to the two rails.

4. The server according to claim 3, wherein the first hard disk assembly is pivoted between the two first ends and the two second ends of the two supporting parts.

5. The server according to claim 3, wherein when the first hard disk assembly is in the stored position, the first hard disk assembly is laid on the tray, and the handle structure is laid on the first hard disk assembly.

6. The server according to claim 5, wherein when the handle structure is pivoted relative to the first hard disk assembly, and the bridge part of the handle structure is moved away from the first hard disk assembly, the two second ends of the two supporting parts of the handle structure are respectively slid along the two rails in a first direction, and the handle structure and the first hard disk assembly are pivoted in opposite directions; the first hard disk assembly is pivoted by the handle structure from the stored position to the inclined position, and the first opening is exposed when the first hard disk assembly is in the inclined position.

7. The server according to claim 1, wherein the handle structure further comprises a first fastener; when the first hard disk assembly is in the stored position, the first hard disk assembly and the processing module are placed adjacent to each other, the handle structure is laid on the first hard disk assembly, and the handle structure is fastened to the processing module via the first fastener.

8. The server according to claim 7, further comprising a second fastener, disposed on a side of the processing module facing the first hard disk assembly, the second fastener having a fastening indentation; when the handle structure is laid on the first hard disk assembly, the first fastener of the handle structure is engaged with the fastening indentation of the second fastener in order to fix the handle structure to the processing module.

9. The server according to claim 1, wherein each of the first hard disk assembly and the second hard disk assembly is configured to store a plurality of hard disks.

\* \* \* \* \*